United States Patent
Lee et al.

(10) Patent No.: US 6,506,682 B1
(45) Date of Patent: Jan. 14, 2003

(54) NON-SELECTIVE SLURRIES FOR CHEMICAL MECHANICAL POLISHING OF METAL LAYERS AND METHOD FOR MANUFACTURING THEREOF

(75) Inventors: Jong Won Lee, Sungnam (KR); Sang Rok Hah, Seoul (KR)

(73) Assignee: Samsung Electronics Co., Ltd. (KR)

( * ) Notice: Subject to any disclaimer, the term of this patent is extended or adjusted under 35 U.S.C. 154(b) by 100 days.

(21) Appl. No.: 09/670,468

(22) Filed: Sep. 26, 2000

(30) Foreign Application Priority Data

Nov. 18, 1999 (KR) .............................................. 99-51339

(51) Int. Cl.$^7$ ...................... H01L 21/302; H01L 21/461
(52) U.S. Cl. ...................... 438/693; 438/692; 438/754; 252/79.3; 252/79.4; 51/308; 51/309
(58) Field of Search ................................ 438/692, 693, 438/754; 252/79.3, 79.4; 51/308, 309

(56) References Cited

U.S. PATENT DOCUMENTS

| | | |
|---|---|---|
| 5,726,099 A | 3/1998 | Jaso ............................ 438/693 |
| 5,858,813 A | 1/1999 | Scherber et al. ............ 438/693 |
| 5,866,031 A | 2/1999 | Carpio et al. ............... 252/79.1 |
| 5,916,855 A | 6/1999 | Avanzino et al. ............. 51/307 |
| 5,922,091 A | 7/1999 | Tsai et al. ..................... 51/306 |
| 5,993,686 A * | 11/1999 | Streinz et al. ............. 252/79.3 |
| 6,147,002 A * | 11/2000 | Kneer ........................ 438/692 |

\* cited by examiner

Primary Examiner—Alexander Ghyka
(74) Attorney, Agent, or Firm—Mills & Onello, LLP

(57) ABSTRACT

The present invention relates to non-selective slurries for chemical-mechanical polishing of a metal layer and a method for manufacturing thereof, and further to a method for forming a plug in an insulating layer on a wafer using such a slurry. More particularly, a slurry is provided for polishing chemically and mechanically simultaneously a metal layer, a barrier layer and an insulating layer used in a semiconductor integrated circuit, which maintains a pH in the range of weak acidity to weak alkalinity by including a first oxidizing agent to reduce a second oxidizing agent, the second oxidizing agent originally being reduced by oxidizing a metal layer. The second oxidizing agent is recycled by recovering the oxidizing power of the first oxidizing agent. An additive increases a polishing rate of the barrier layer and an abrasive is provided to the slurry in an aqueous medium. In this manner, slurry of the present invention can provide a flat finish to the surface of the insulating layer where a plug is formed by removing the metal layer, the barrier layer and the insulating layer simultaneously in one CMP process, since the polishing removal rates of the metal layer, the barrier layer and the insulating layer are substantially equal.

21 Claims, 7 Drawing Sheets

NON-SELECTIVE SLURRIES FOR CHEMICAL MECHANICAL POLISHING OF METAL LAYERS AND METHOD FOR MANUFACTURING THEREOF

BACKGROUND OF THE INVENTION

1. Field of the Invention

The present invention relates to non-selective slurries used for chemical mechanical polishing (CMP) of a metal layer and a method for manufacturing thereof, and further to a method for forming a plug in an insulating layer on a wafer. More particularly, the present invention relates to slurries for CMP capable of removing a metal layer, a barrier layer and an insulating layer simultaneously because of nearly equal polishing removal rates and a method for fabricating thereof, and a method for forming a plug in a wafer insulating layer using such a slurry.

2. Description of the Related Art

As the relative sizes of semiconductor devices are scaled down and as the number of metal wire layers increases, surface irregularities are more likely to be transcribed onto adjacent layers, and, as a result, the degree of bending of the uppermost layer increases. In some cases, such bending may have such a drastic influence on the device structure, so that it is impossible to form a desired shape in the next processing step. Additionally, as devices become more highly integrated, a bottom film planarization technology is required to assure photo margin and to minimize wire length.

In view of the above, a planarization process has become popular as a means for removing the bending of an irregular surface during the semiconductor fabrication process.

Popular methods for planarizing the bottom film include SOG(Spin On Glass), etch-back, BPSG(boro-phospho silicate glass) reflow, Al flow, and CMP. Among these techniques, CMP has become recognized as an effective planarization technology and is used widely because CMP accomplishes both global planarization and low temperature planarization of a relatively wide space, which can not be accomplished by, for example, the reflow or etch-back processes.

In the CMP process, a rotating polishing pad is pressed in direct contact with the wafer and a polishing slurry is provided to the wafer/pad interface. The surface of the wafer is planarized and polished mechanically and chemically by the polishing pad coated with the slurry. The polishing rate, the polished surface imperfections, defects, and corrosion and erosion vary according to the composition of the slurry.

A method for forming a plug using a CMP process according to the conventional approaches is now described, with reference to FIG. 1a through FIG. 1f.

Referring to FIG. 1a, after depositing a metal of conductive material on a semiconductor substrate 100, a metal pattern 102 is formed by a photolithography process. As shown in FIG. 1b, after depositing an interlayer insulating film 104 of low dielectric film on the metal pattern 102, the surface of the insulating film is planarized by performing a first CMP process on the insulating film using a slurry having a high polishing selectivity ratio.

FIG. 1c shows the results of the first CMP process. In the CMP process, a surface of a wafer is placed in direct contact with a polishing pad attached to a rotating table in direct contact with the pad. During the polishing process, a carrier applies pressure against the wafer while the pad and table are rotated. A slurry is provided between the wafer and pad, and polishing is facilitated by the rotational movement of the pad and is continued in this manner until the low dielectric film 104 is planarized. Defects such as scratches or pitting 106 can be created on a portion of the surface of the interlayer insulating film 104 by, for example, solid abrasives within the slurry.

Referring to FIG. 1d, a via hole 108 is formed by a photolithography process on said planarized insulating film 104. Then, as shown in FIG. 1e, a barrier layer 110 and metal layer 112 such as titanium(Ti) or titanium nitride(TiN) are deposited successively on the wafer where the via holes 108 are formed.

Finally, the metal layer 112 and the barrier layer 110 on the low dielectric film 104 are removed by a second CMP process using a slurry, for example as referred to in U.S. Pat. Nos. 5,922,091, 5,916,855, 5,858,813 and 5,866,031, having a good selectivity to the metal. A sidewall layer and a metal layer remain within the via hole 108 and thus a via plug 114 is formed as shown in FIG. 1f.

However, if a slurry having different selectivities for the metal and the dielectric film is used, as shown in FIG. 1f, metallic residue 116, possibly inducing a metal bridge, can remain as shown in FIG. 1f in the pitted portions 106 previously created during the planarization of the low dielectric film 104. For this reason, an additional CMP process, or multiple additional CMP processes, must be performed to remove the metal residue. However, these excessive metal CMP procedures, as shown in FIG. 1f, create metal recesses 114 resulting from the selectivity difference and, as a result, the electrical resistance value of the via hole increases.

To address this issue, a non-selective ammonium persulfate slurry is disclosed in U.S. Pat. No. 5,726,099. According to this technique, after planarizing the dielectric film, the pattern formation and the metal deposition are performed, and the metal layer is removed. Finally, the planarization is performed by polishing the metal layer and the insulating layer simultaneously using the non-selective slurry. In this manner, metallic residue is removed and the generation of metal recesses is prevented; however, the process is complicated and therefore expensive to carry out.

Furthermore, the excessive use of a slurry having an oxidizing agent in order to increase the removal rate of a metal adversely affects device yield through the lowering of the electrical characteristics of the device, or the worsening of metal corrosion following the CMP process arising from an increase in the impurity density within the slurry. Further, the competitive power of the resulting product is lowered because of the deterioration of slurry quality, the increase of danger, and the increase of the fabrication cost of the slurry.

SUMMARY OF THE INVENTION

An object of the present invention is to provide non-selective slurries capable of removing a metal layer, a barrier layer and an insulating layer simultaneously during a single CMP process using non-selective slurries with nearly equal polishing rates and a method for fabricating thereof.

Another object of the present invention is to provide non-selective slurries and a method for fabricating thereof which reduces the fabrication cost of a slurry by using a small amount of oxidizing agent with the recycling of the oxidizing agent, and which improves the quality and the safety of the slurry.

A further object of the present invention is to provide a method for forming a plug in an insulating layer on a wafer that enables the simplification of the fabrication process by removing a metal layer, a barrier layer and an insulating layer simultaneously by a single CMP process using non-selective slurries.

According to one aspect of the present invention to accomplish said objects, a non-selective slurry of the present invention is provided. The non-selective slurry simultaneously chemically and mechanically polishes a metal layer, a barrier layer and an insulating layer. The slurry comprises a first oxidizing agent for reducing a second oxidizing agent, the second oxidizing agent being reduced by oxidizing said metal layer, and being recycled by the first oxidizing agent recovering the oxidizing power of the second oxidizing agent. An additive for increases the polishing rate of said barrier layer, and an abrasive is provided in an aqueous medium, such that the removal rates over said metal layer, barrier layer and insulating layer are nearly equal.

A method for fabricating a non-selective slurry of the present invention comprises a step of preparing an abrasive for polishing an insulating layer of strong alkalinity, a step of making a slurry of strong acidity by adding a first oxidizing agent and a second oxidizing agent into the abrasive for polishing an insulating layer and adding an acid for controlling pH, and a step of adding $NH_4F$ to maintain the pH of the slurry within the range of weak acidity or weak alkalinity.

Another method for fabricating a non-selective slurry of the present invention comprises a step of preparing a silica solution of pH 4.5, a step of making a slurry of strong acidity for polishing a metal layer by adding a first and a second oxidizing agent into the silica solution and adding an acid for controlling pH, and a step of adding $NH_4F$ to maintain the pH of the slurry for polishing a metal layer within the range of weak acidity or weak alkalinity.

A method for forming a plug of the present invention comprises the steps of: forming an insulating layer on a semiconductor wafer; forming a via hole in said insulating layer; depositing a barrier layer uniformly on the insulating layer where said via hole is formed; depositing a metal layer on said barrier layer in order for said via hole to be filled; and revealing the surface of said insulating layer flatly by polishing said metal layer, barrier layer and insulating layer chemically and mechanically simultaneously by applying a non-selective slurry having nearly equal polishing rates to said metal layer, barrier layer and insulating layer.

According to a non-selective metal slurry and a CMP method using thereof by the present invention, the following effects are acquired.

First, the fabrication cost is reduced through process simplification.

Second, the etching depth is reduced and the margin as to the etching process is assured by reducing the deposition thickness of a low dielectric film and a metal because the planarization is proceeded to an oxide during metal CMP.

Third, the degree of process completion can be improved by reducing the corrosion phenomenon occurring due to the difference of the removal rates of tungsten and titanium, because the removal rates of tungsten and titanium are substantially-equal.

Fourth, the total amount of added oxidizing agents can be greatly reduced much while still using two oxidizing agents.

Therefore, the present invention can greatly reduce slurry cost, and can assure the quality and the safety of a slurry by adding a small amount of oxidizing agent, and readily controls the metal removal rate.

BRIEF DESCRIPTION OF THE DRAWINGS

Further objects and advantages of the present invention can be more fully understood from the following detailed description taken in conjunction with the accompanying drawings.

DETAILED DESCRIPTION OF PREFERRED EMBODIMENTS

Figure 1A:
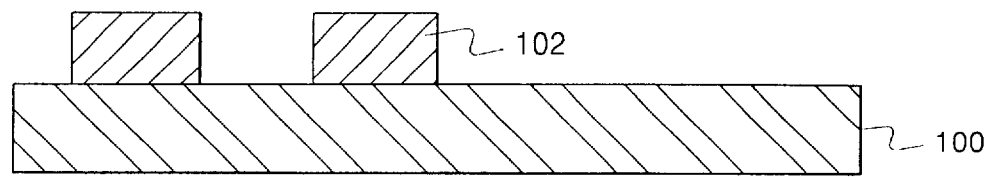
FIG. 1a through FIG. 1f are process flow diagrams showing a method for forming a plug by using a CMP process using selective slurries according to conventional techniques.
Figure 1B:
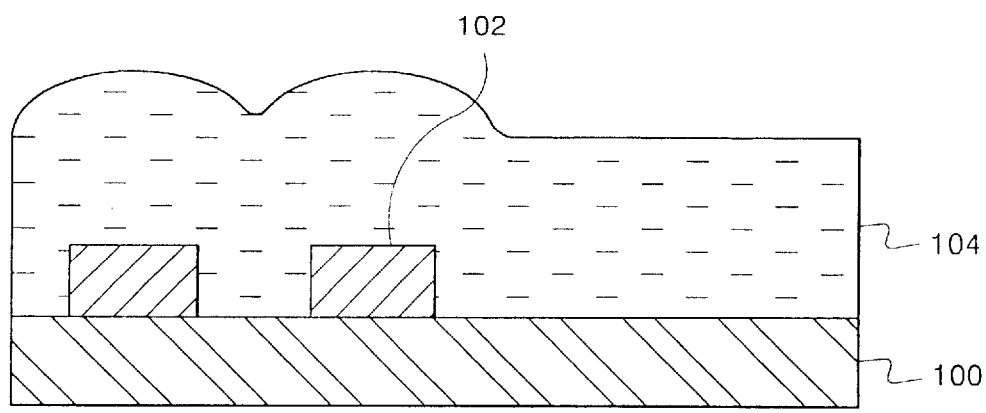
Figure 1C:
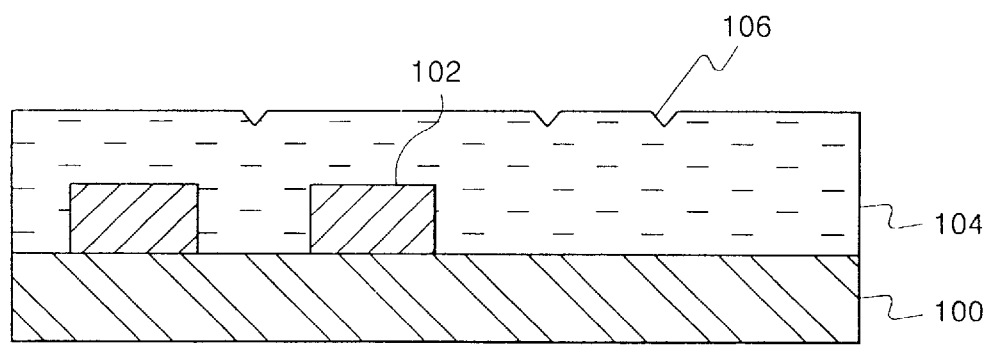
Figure 1D:
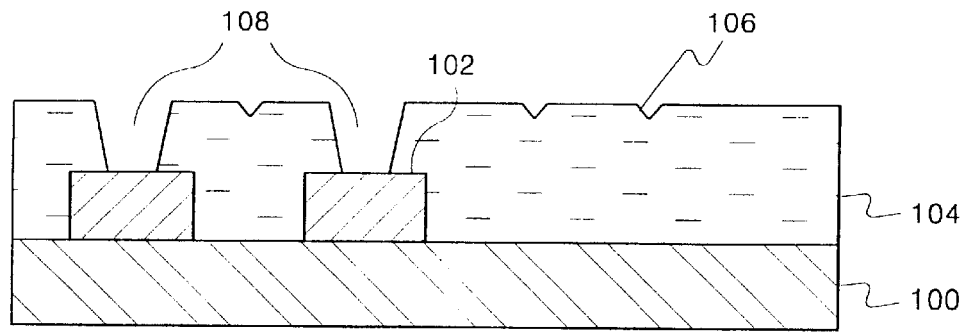
Figure 1E:
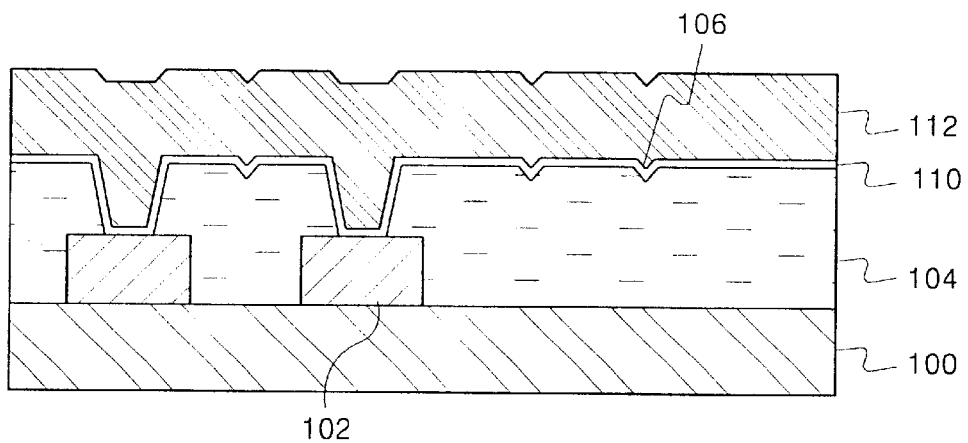
Figure 1F:
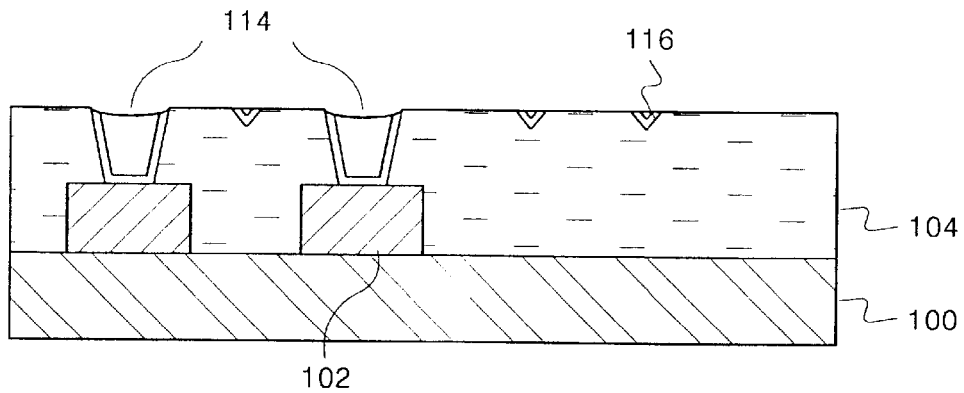

In the present invention, first and second oxidizing agents having different reaction mechanisms induce an oxidation reaction with a metal using a slurry. The agents are characterized in that a second oxidizing agent loses its oxidation power by removing an electron from the metal. The first oxidizing agent, for example an agent having a high reduction potential, recovers the oxidation power of the second oxidizing agent, by taking away an electron from the second oxidizing agent. The second oxidizing agent preferably has a high oxidation reaction rate with the metal and a low reduction potential.

In the present invention, an oxidizing agent, for example, belonging to the same chain as hydrogen peroxide, having a slow oxide formation rate and a slow etching reaction rate because it has a high reduction potential and a high oxidizing power, is defined as a first oxidizing agent. On the other hand, an oxidizing agent belonging to the same chain as iron nitrate $Fe(NO_3)_3$ which has a low reduction potential and a low oxidation power but has a fast oxidation reaction rate with a metal is defined as a second oxidizing agent.

First oxidizing agents of peroxide compounds include, for example, hydrogen peroxide $H_2O_2$, benzoly peroxide $(C_6H_5CO)_2O_2$, calcium peroxide $CaO_2$, barium peroxide $BaO_2$, and sodium peroxide $Na_2O_2$. Among these, hydrogen peroxide is preferred. It is preferred that the hydrogen peroxide in an amount ranging from about 0.01 wt % to 10 wt % is present in the slurry composition and most preferably in the range of 0.5 wt % to 5 wt %. In the case of amounts below 0.01 wt %, it is difficult for the slurry to be applied to a fabrication process because the removal rate would be too low, and in the case of amounts above 10 wt % the removal rate is improved, but metal corrosion would be too extreme.

Second oxidizing agents of iron compounds include, for example, ferric nitrate, ferric phosphate, ferric sulfate or potassium ferricyanide, and among these, ferric nitrate is preferred. It is preferred that ferric nitrate is present in said slurry composition in an amount ranging from about 0.01 wt % to 10 wt % and most preferably from about 0.05 wt % to 0.5 wt %. In the case of an amount below 0.01 wt %, application to a fabrication process would be difficult because the removal rate would be too low. In the case of an amount above 10 wt % the phenomenon of slurry aggregation occurs because the self-dispersion property of the slurry is lowered.

It is preferred to use one of alumina, silica and ceria as an abrasive in the slurry. Particularly, it is preferred that colloidal silica is present in slurry composition in an amount ranging from about 3 wt % to 25 wt % and more preferably from about 5 wt % to 12.5 wt %.

Fluorine compounds such as $NH_4F$, Tetra Butyl Ammonium Floride TBAF, Potassium Floride, Benzyl Trimethyl Ammonium Floride, Trimethyl Amine Tris-hydro Floride, Triethyl Amine Tris-hydro Floride $C_6H_{15}N_3HF$ are preferred as an additive of non-selective slurries of the present invention.

By adding said $NH_4F$, the pH of a slurry is adjusted to be in the range of weak acidity or weak alkalinity from approximately 6 to 8. It is preferred that $NH_4F$ is present in an amount of about 1 wt %. The pH maintenance of a slurry in this manner removes an insulating layer effectively and improves the removal rate of a barrier layer.

Preferred embodiments of the present invention will be described in detail as follows with reference to the accompanying drawings.

Figure 2:
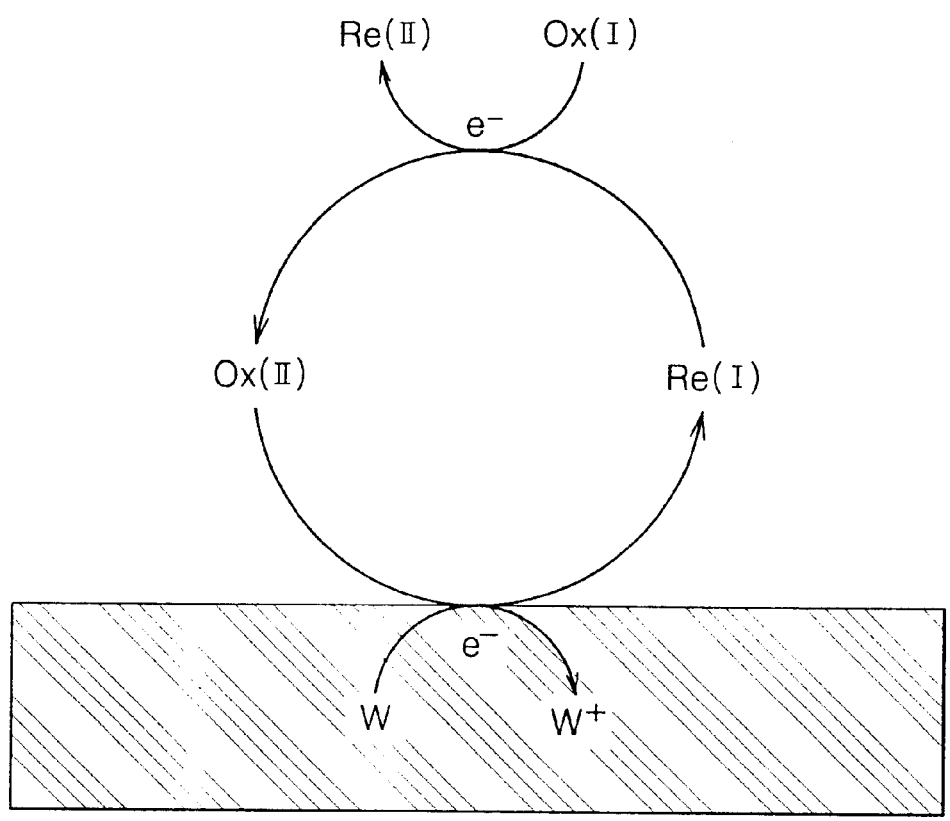
FIG. 2 illustrates the reaction between a metal and two types of oxidizing agents added in a slurry according to the present invention.

FIG. 2 illustrates the reaction mechanism between a metal and two kinds of oxidizing agents added in a slurry according to the present invention.

Generally, a slurry used in a metal CMP process comprises an oxidizing agent oxidizing a metal and a solid abrasive, and acid and deionized water (DIW) added to operate as a controller for adjusting the pH of the slurry. One of the compositions which primarily governs the characteristics of the slurry is the oxidizing agent.

An oxidizing agent added to the slurry undergoes an oxidation reaction with a metal generally and removes an electron from the metal and is thereby reduced. On the other hand, the metal whose electron is taken away is combined with oxygen in the slurry and forms an oxide in the form of Metal-O, or is dissolved or chemically etched into the slurry as being an anion in the form of $M^-$. An oxide formed by said oxidizing agent is easily removed by the frictional force between an abrasive and the pad because the oxide is more readily removable than metal itself.

In the present invention, an Fe ion of 3+ valence $Fe^{3+}$ of a second oxidizing agent Ox(II), having a fast reaction rate, oxidizes tungsten with a fast reaction rate, and hydrogen peroxide of a first oxidizing agent Ox(I) reoxidizes a reduced Re(I) Fe ion of $2^+$ valence $Fe^{2+}$ into an Fe ion of 3+ valence $Fe^{3+}$ and is dissolved into $H_2O$ and $O_2$. Oxidized Fe ion of 3+ valence $Fe^3+$ forms an oxide by reacting again with tungsten, or removes tungsten metal by permeating into the tungsten directly.

In this manner the cost of a slurry can be reduced by reducing the total amount of added oxidizing agent, while still using two oxidizing agents, while the quality and safety of a slurry is assured and the removal rate of a metal is easily controlled because only a small amount of oxidizing agent is added.

Figure 3:
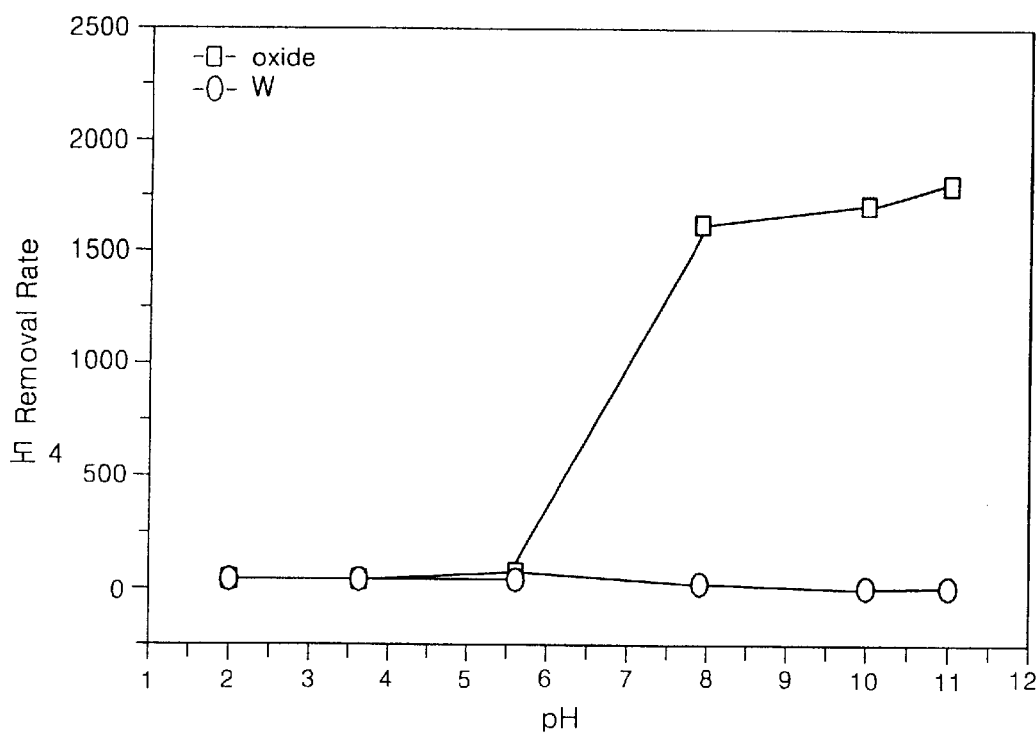
FIG. 3 is a graph showing the relationship between the removal rates of tungsten and oxide as a function of the pH of the oxide slurry, in the case where an oxidizing agent is not added, according to the present invention.

FIG. 3 is a graph showing the change of the removal rates of tungsten and oxide as a function of slurry pH, where a silica is used as an abrasive and an oxidizing agent is not added.

General oxide removal mechanism is that an oxide having a molecule structure in the form of $-\!(\!-\!O\!-\!Si\!-\!O\!-\!)\!-_n$ forms a bond with a hydroxy radical $OH^-$ in a slurry and forms a hydrate in the form of Si—OH silanol and then is removed by a continuous action of a process of being removed by an abrasive. Therefore, as shown in FIG. 3, because the amount of $OH^-$ capable of forming a hydrate in a slurry is reduced as the pH of the slurry goes down into acidity gradually, the removal rate of an oxide is rapidly reduced. On the other hand, the removal rate of a tungsten metal according to the pH of the slurry hardly varies because there is no oxidizing agent in the slurry.

Therefore, a non-selective slurry with low selectivities to tungsten, titanium and an oxide, that is, having substantially equal removal rates, can be fabricated by controlling pH, by using silica as an abrasive and adding an oxidizing agent capable of improving the removal rate of titanium used widely as a barrier layer in a tungsten slurry of high acidity.

In a preferred embodiment of the present invention, first a silica abrasive maintaining 4.5 pH is prepared. Hydrogen peroxide $H_2O_2$ of a first oxidizing agent in an amount ranging from about 0.5 wt % to 5 wt % and ferric nitrate of a second oxidizing agent in an amount ranging from about 0.05 wt % to 0.5 wt % are added. First, a tungsten slurry of high acidity is formed by adjusting the pH of the slurry to be maintained within the range from 2 to 2.5 using $H_2SO_4$. Then, a non-selective slurry is fabricated by adjusting the pH to about 6.8 by adding about 1 wt % $NH_4F$.

According to the present invention, first, an abrasive for polishing a general oxide film of strong alkalinity of pH 11 is prepared, and a first and a second oxidizing agent are added to the abrasive for polishing an oxide. A slurry of strong acidity having a pH ranging from 2 to 2.5 is formed by adding acid for adjusting pH. Then, a non-selective slurry can be fabricated by adding $NH_4F$ so that the pH of the slurry is maintained within the range of weak acidity or weak alkalinity from 6 to 8.

Figure 4:
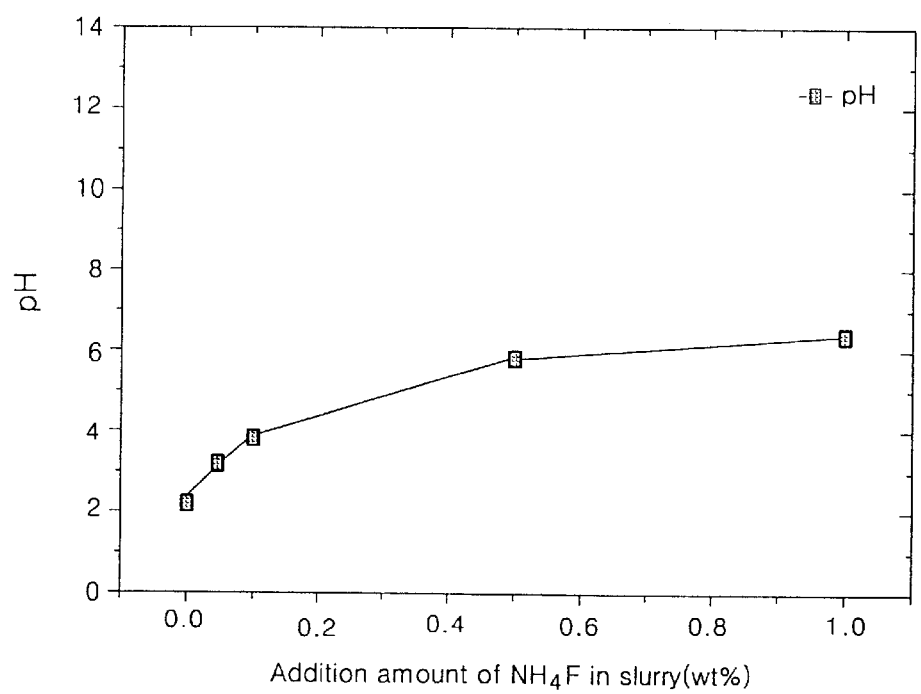
FIG. 4 is a graph showing the pH variation of a slurry as a function of an added amount of ammonium fluoride.

FIG. 4 is a graph showing the pH variation of a slurry according to the addition amount of an ammonium fluoride $NH_4F$. That is, it can be known in the present invention that in case of not adding $NH_4F$, the slurry is maintained to be pH 2 of high acidity, and as the addition amount of $NH_4F$ increases, the acidity decreases and the pH of the slurry is varied to weak acidity of about 6 in an amount of about 1 wt %. That is, the pH is varied from strong acidity to weak acidity by neutralizing, as the $NH_4F^+$ radical reacts with an acid radical in an aqueous water, and ionized fluorine ion $F^-$ acts as an oxidizing agent for oxidizing titanium. Therefore, as the pH varies to weak acidity of about 6, the removal rate of tungsten is decreased and the removal rate of oxide is increased.

Figure 5:
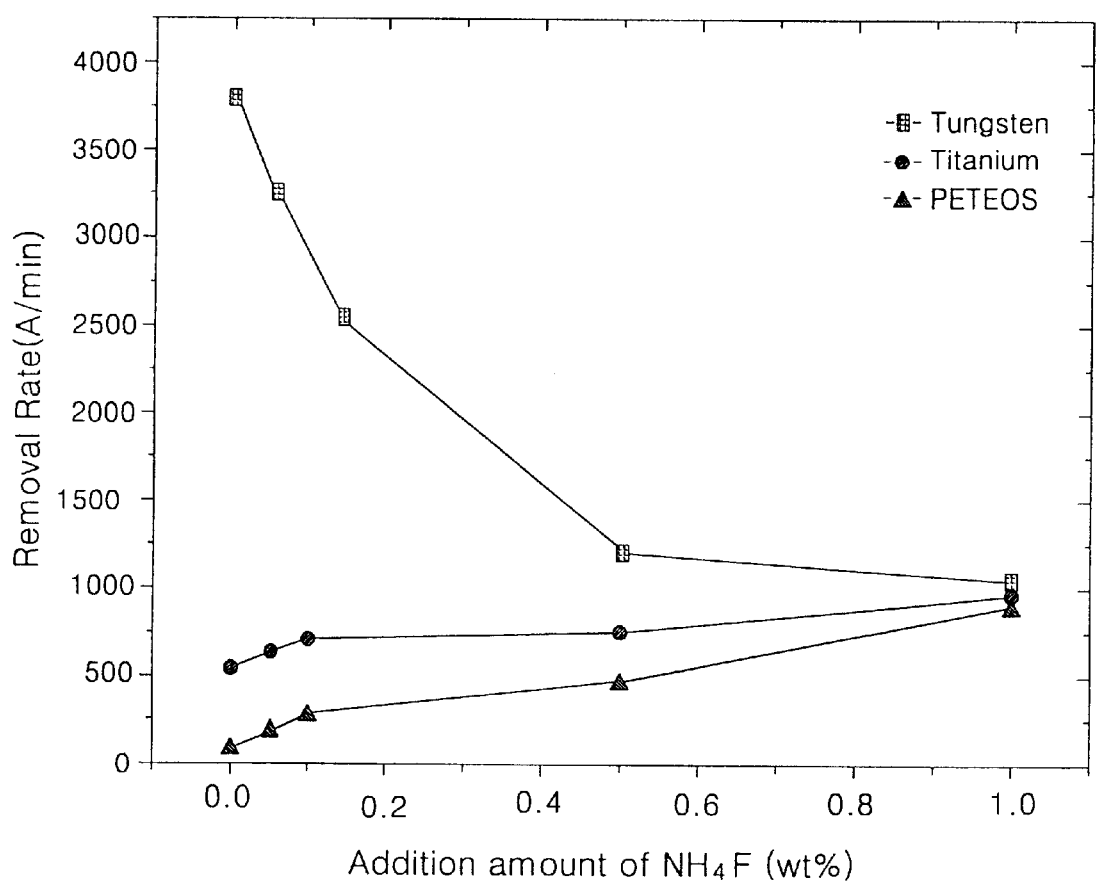
FIG. 5 is a graph showing removal rates of tungsten, titanium and PETEOS as functions of the added ammonium fluoride.

FIG. 5 is a graph showing removal rates of tungsten, titanium, and PETEOS as a function of added ammonium fluoride. According to FIG. 5, as the amount of $NH_4F$ increases, the removal rate of tungsten decreases and the removal rates of titanium and an oxide increase, and when the amount of $NH_4F$ is about 1 wt %, the removal rates of tungsten, titanium and oxide become nearly equal.

In the case of adjusting the pH of a slurry to about 6.8 with the addition of $NH_4F$, the removal rates of tungsten, titanium and an oxide are described in the following Table 1.

TABLE 1

| Slurry condition | Removal rate (Å/min) | | |
|---|---|---|---|
| PH | Tungsten | Titanium | Oxide |
| 6.8 | 847 | 750 | 705 |

As shown in table 1, the removal rates of tungsten, titanium and oxide are according to the ratio of 1:0.89:0.83, and are nearly equal.

An example of applying a non-selective slurry of the present invention to a plug CMP process is described as follows with reference to FIG. 6a through FIG. 6e.

Figure 6A:
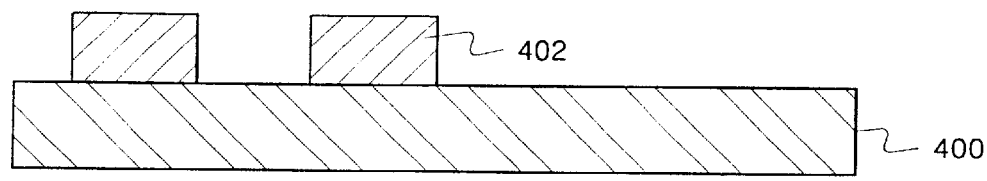
FIG. 6a through FIG. 6e are process flow diagrams showing a method for forming a plug by using a CMP process employing non-selective slurries according to the present invention.

First, as shown in FIG. 6a, a metal pattern 402 is formed by a photolithography process after depositing a conductive material of a metal, for example, tungsten, aluminum, copper, or an alloy of said metals, on a semiconductor substrate 400.

Figure 6B:
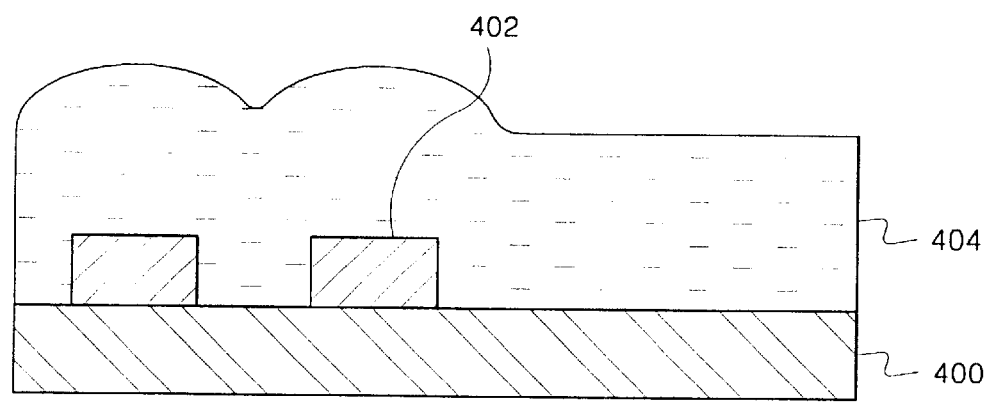

Referring to FIG. 6b, an interlayer insulating film 404 is formed by depositing a low dielectric film, for example, an oxide film such as SOG, BPSG, $O_3$-TEOS, USG, PETEOS and FOX.

Figure 6C:
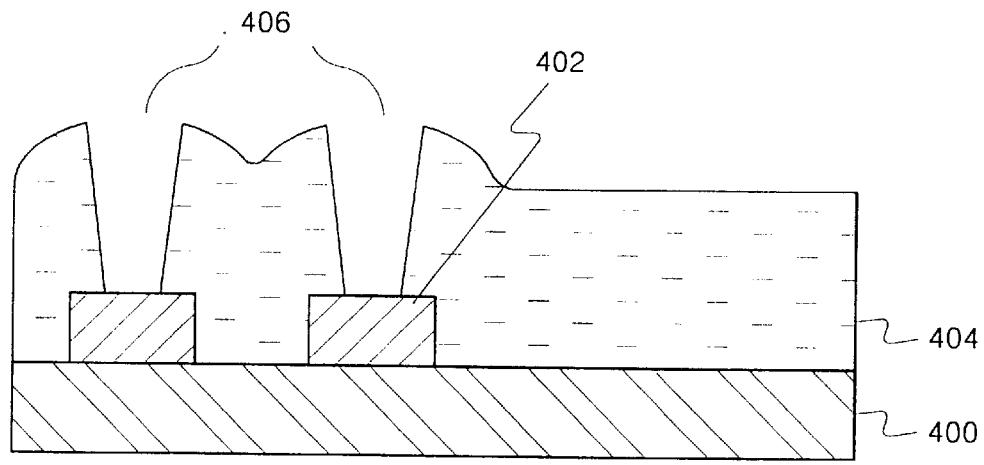

Referring to FIG. 6c, a via hole 406 is formed during a photolithography process on the interlayer insulating film 404 directly, without the planarization process of said low dielectric film 404.

Figure 6D:
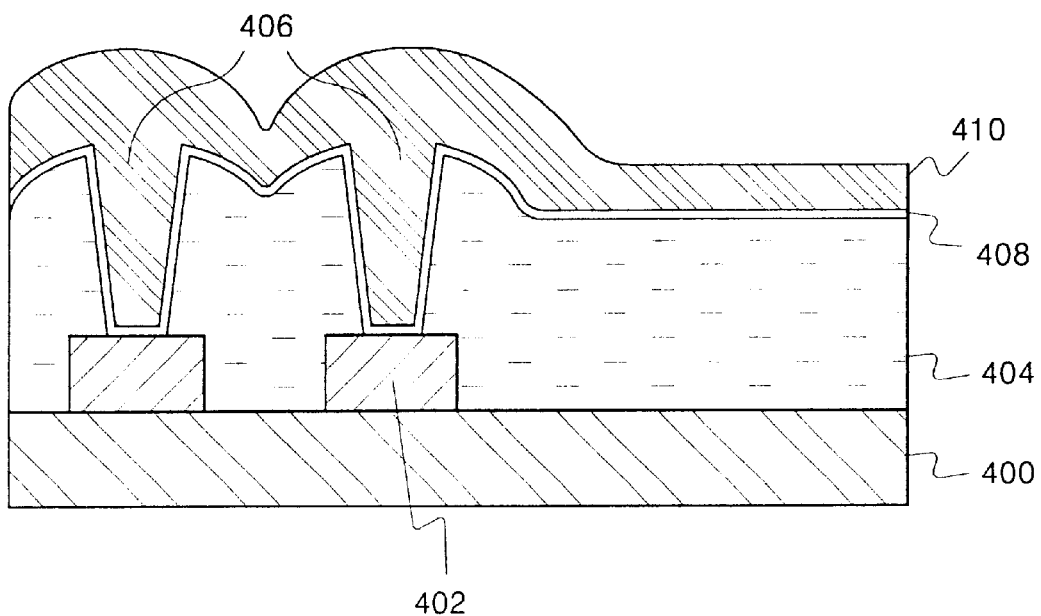

Referring to FIG. 6d, then, the via hole 406 is filled up by depositing a barrier layer 408 such as titanium or titanium nitride, and successively depositing a metal layer 410, for example tungsten.

Figure 6E:
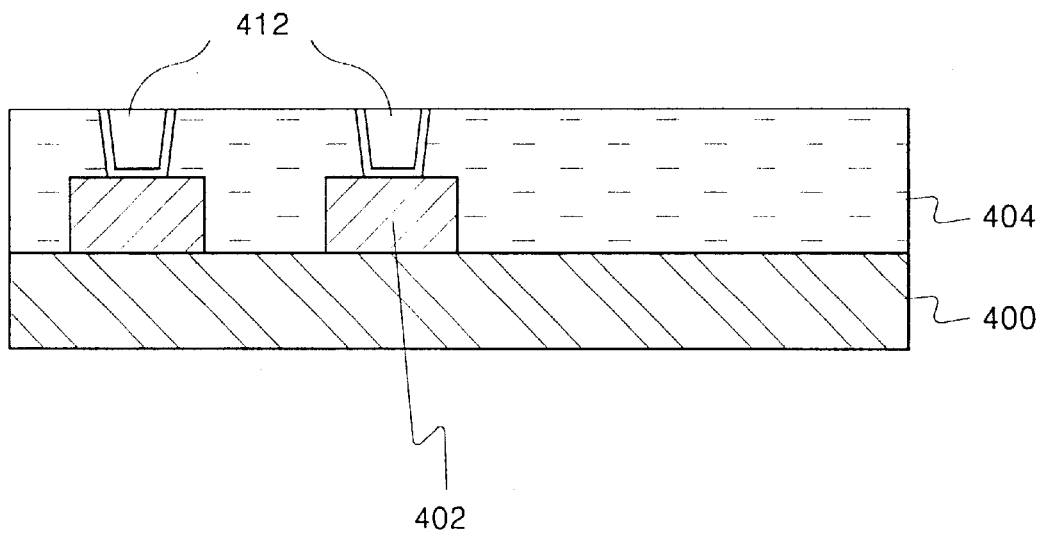

Finally, an interlayer insulating film having a flat surface as shown in FIG. 6e is formed, by removing said metal layer 410, barrier layer 408 and interlayer insulating film 404 together by performing CMP process using a non-selective slurry according to the present invention. Therefore, a via plug 412 having a flat upper surface is formed in the via hole 406.

As described above, because the removal rates of the metal and the oxide are identical, an additional oxide planarization procedure can be removed, by removing the metal and the oxide simultaneously in one CMP process. Without the additional oxide planarization process, defects such as scratches or pitting 106 created during oxide planarization are avoided and metal residue is substantially eliminated.

Also, the metal recess phenomenon that otherwise would occur due to the difference of selectivity of a metal and an oxide after metal deposition is avoided.

As described above, the non-selective metal slurry and a CMP method using thereof provided by the present invention, confer the following beneficial effects.

First, the fabrication cost is reduced through process simplification.

Second, the etching amount is reduced and the etching process margin is assured by reducing the deposition thickness of a low dielectric film and a metal because the planarization is proceeded to an oxide during metal CMP.

Third, the degree of process completion is improved by reducing the corrosion phenomenon occurring due to the difference of the removal rates of tungsten and titanium, because the removal rates of tungsten and titanium are substantially equal.

Fourth, the total amount of additional oxidizing agents can be greatly reduced.

In this manner, the aforementioned techniques can greatly reduce the cost of a slurry, and can assure the quality and the safety of a slurry by adding a small amount of oxidizing agent, and can readily control the removal rate of metal.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A non-selective slurry for simultaneously chemically and mechanically polishing a metal layer, a barrier layer and an insulating layer, said slurry consisting essentially of:
    (a) about 0.01 wt. % to 10 wt. % of a first oxidizing agent selected from the group consisting of peroxide compounds having the capacity to restore in situ the oxidizing power of a second oxidizing agent in the slurry after the second oxidizing agent has oxidized a portion of the metal layer;
    (b) about 0.01 wt. % to 10 wt. % of a second oxidizing agent selected from the group consisting of iron compounds in which the Fe ions have a valence of 3+;
    (c) an additive for increasing a polishing rate of said barrier layer and for adjusting the pH within a range of from approximately 6 to 8; and
    (d) an abrasive in an aqueous medium, wherein the removal rates over said metal layer, barrier layer and insulating layer are nearly equal.

2. The non-selective slurry as claimed in claim 1, wherein said metal layer is selected from the group consisting of tungsten, tungsten alloy, and mixtures thereof.

3. The non-selective slurry as claimed in claim 1, wherein said first oxidizing agent is hydrogen peroxide.

4. The non-selective slurry as claimed in claim 1 wherein said peroxide compound is selected from the group consisting of hydrogen peroxide $H_2O_2$, benzoly peroxide $(C_6H_5CO)_2O_2$, calcium peroxide $CaO_2$, barium peroxide $BaO_2$, and sodium peroxide $Na_2O_2$.

5. The non-selective slurry as claimed in claim 1, wherein said peroxide compound is present in said slurry composition in an amount ranging from about 0.5 wt. % to 5 wt. %.

6. The non-selective slurry as claimed in claim 1, wherein said iron compound is selected from the group consisting of ferric nitrate, ferric phosphate, ferric sulfate, and potassium ferricyanide.

7. The non-selective slurry as claimed in claim 1, wherein said iron compound is ferric nitrate.

8. The non-selective slurry as claimed in claim 1, wherein said abrasive is present in said slurry composition in an amount ranging from about 3 wt % to 25 wt %.

9. The non-selective slurry as claimed in claim 1, wherein said additive is $NH_4F$.

10. The non-selective slurry as claimed in claim 9, wherein said $NH_4F$ is present in an amount of about 1 wt %.

11. A method for preparing a non-selective slurry composition comprising the steps of:
    (a) forming a first slurry composition of strong acidity by combining an abrasive for polishing an insulating layer with about 0.01 wt. % to 10 wt. % of a first oxidizing agent selected from the group consisting of peroxide compounds having the capacity to restore in situ the oxidizing power of a second oxidizing agent in the slurry after the second oxidizing agent has oxidized a portion of the metal layer, about 0.01 wt. % to 10 wt.

% of a second oxidizing agent selected from the group consisting of iron compounds in which the Fe ions have a valence of 3+ and an acid for controlling pH to about 2 to 2.5; and (b) subsequently adding an additive to the first slurry composition to form a second slurry composition so that the pH of said second slurry composition is maintained within the range of weak acidity to weak alkalinity at a pH of approximately 6–8.

12. The method for preparing a non-selective slurry composition as claimed in claim 11, wherein said additive is $NH_4F$ added in an amount of about 1 wt %.

13. The method for preparing a non-selective slurry composition as claimed in claim 11, wherein said first oxidizing agent is hydrogen peroxide.

14. The method for preparing a non-selective slurry composition as claimed in claim 11, wherein said peroxide compound is selected from the group consisting of hydrogen peroxide $H_2O_2$, benzoyl peroxide $(C_6H_5CO)_2O_2$, calcium peroxide $CaO_2$, barium peroxide $BaO_2$ and sodium peroxide $Na_2O_2$.

15. The method for preparing a non-selective slurry composition as claimed in claim 11, wherein said peroxide compound is present in said slurry composition in an amount ranging from about 0.5 wt. % to 5 wt. %.

16. The method for preparing a non-selective slurry composition as claimed in claim 11, wherein said iron compound is selected from the group consisting of ferric nitrate, ferric phosphate, ferric sulfate, and potassium ferricyanide.

17. The method for preparing a non-selective slurry composition as claimed in claim 1, herein said iron compound is ferric nitrate.

18. A non-selective slurry according to claim 1 wherein said iron compound is present in said slurry composition in an amount ranging from about 0.05 wt. % to 0.5 wt. %.

19. A method for preparing a non-selective slurry composition according to claim 11 wherein said iron compound is present in said slurry composition in an amount ranging from about 0.05 wt. % to 0.5 wt. %.

20. A non-selective slurry according to claim 1 wherein said additive for increasing a polishing rate of said barrier layer is selected from the group consisting of $NH_4F$, tetra butyl ammonium fluoride TBAF, potassium fluoride, benzyl trimethyl ammonium fluoride, trimethyl amine tris-hydro fluoride, and triethyl amine tris-hydro fluoride $C_6H_{15}N_3HF$.

21. A method for preparing a non-selective slurry composition according to claim 11 wherein said additive is selected from the group consisting of $NH_4F$, tetra butyl ammonium fluoride TBAF, potassium fluoride, benzyl trimethyl ammonium fluoride, trimethyl amine tris-hydro fluoride, and triethyl amine tris-hydro fluoride $C_6H_{15}N_3HF$.

* * * * *

UNITED STATES PATENT AND TRADEMARK OFFICE
CERTIFICATE OF CORRECTION

PATENT NO.    : 6,506,682 B1
DATED         : January 14, 2003
INVENTOR(S)   : Jong Won Lee et al.

It is certified that error appears in the above-identified patent and that said Letters Patent is hereby corrected as shown below:

<u>Column 10,</u>
Line 5, delete "herein" and insert -- wherein --.

Signed and Sealed this

Eighth Day of April, 2003

JAMES E. ROGAN
*Director of the United States Patent and Trademark Office*